ID#

United States Patent [19]
Greenwood et al.

[11] Patent Number: 5,598,967
[45] Date of Patent: Feb. 4, 1997

[54] METHOD AND STRUCTURE FOR ATTACHING A CIRCUIT MODULE TO A CIRCUIT BOARD

[75] Inventors: Jonathon G. Greenwood, Boynton Beach; Douglas W. Hendricks, Boca Raton; Frank Juskey, Coral Springs, all of Fla.

[73] Assignee: Motorola, Inc., Schaumburg, Ill.

[21] Appl. No.: 418,132

[22] Filed: Apr. 4, 1995

[51] Int. Cl.⁶ .............................. B23K 1/00; B23K 31/02
[52] U.S. Cl. ................. 228/174; 228/180.21; 228/254; 174/261; 361/768
[58] Field of Search .......................... 228/174, 180.21, 228/254; 174/261; 361/767, 768

[56] References Cited

U.S. PATENT DOCUMENTS

| | | | |
|---|---|---|---|
| 4,034,149 | 7/1977 | Zaleckas | 174/261 |
| 4,565,314 | 1/1986 | Scholz | 228/180.21 |
| 4,790,894 | 12/1988 | Homma et al. | 228/180.21 |
| 4,889,275 | 12/1989 | Mullen, III et al. | 228/180.2 |
| 5,308,928 | 5/1994 | Parla et al. | 174/261 |

OTHER PUBLICATIONS

"Surface Mount Footprint Improvement", *IBM. Tech. Discl. Bull.*, vol. 31, No. 3, (Aug. 1988) pp. 408–409.

*Primary Examiner*—P. Austin Bradley
*Assistant Examiner*—Jeffrey T. Knapp
*Attorney, Agent, or Firm*—D. Andrew Floam

[57] ABSTRACT

A method of interconnecting circuit modules (30) to mother boards (50) each having a plurality of mating solder pads (32, 52) is available. The solder pads (32, 52) have respective pairs of arms (40, 42) and (54, 56) with a venting channel (36, 58) formed between each pair of arms to vent solder medium when the solder pads are reflowed to interconnect the circuit modules and mother boards.

10 Claims, 3 Drawing Sheets

5,598,967

METHOD AND STRUCTURE FOR ATTACHING A CIRCUIT MODULE TO A CIRCUIT BOARD

FIELD OF THE INVENTION

The present invention relates to interconnecting circuit modules to circuit boards in electronic products, such as pagers.

BACKGROUND OF THE INVENTION

As electronic products have evolved, the size of the electronic components have become increasingly smaller, especially in portable products such as electronic pagers. As the components have decreased in size, the density of the interconnections has increased. One type of interconnection includes circuit modules which commonly are utilized and which are soldered by surface mounting technology to a circuit board, commonly called the mother board.

The method of interconnecting the circuit modules to the mother board, include forming complementary solder pads and surface mounting the circuit modules to the mother board by placing them together and reflowing the solder pads. In forming the connection it is critical that the solder pads are uniformly connected to one another without defects, such as voids or cracks.

It has been discovered that the solder pads can include voids and cracks due to the reflowing solder process. These defects can lead to both structural and/or electronic failure of the completed product. Conventional solutions were attempted, but failed to correct the defects and/or had other undesirable effects.

As one attempted solution, the solder reflow profile was adjusted and controlled but did not eliminate the defects. As another solution, spacers or standoffs were utilized, but added an unwanted additional step and caused an increase in the cost of the product. The spacers also could cause another defect by allowing the solder to flow out and away from the spacers, causing a gap and hence a failed electrical connection.

SUMMARY OF THE INVENTION

A method and apparatus for interconnecting circuit boards, such as circuit modules, to a mother board including venting of the flux medium from the solder pads when the solder is reflowed to connect the circuit modules to the mother board.

DESCRIPTION OF THE PREFERRED EMBODIMENT

Figure 1:
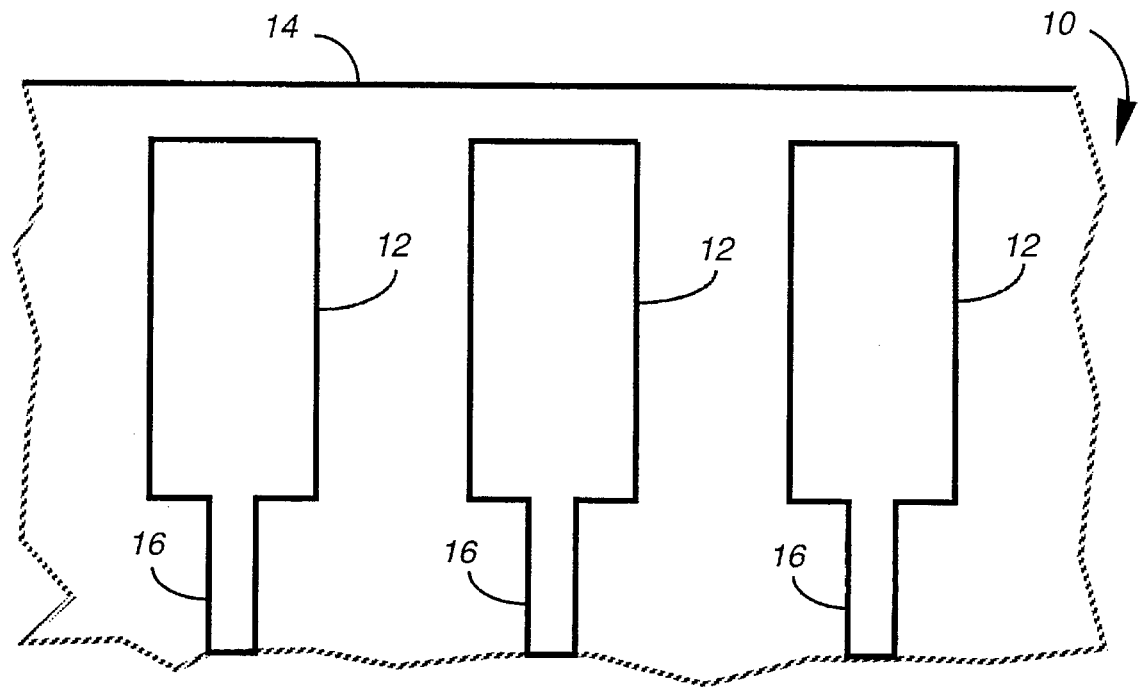
FIG. 1 is a top-plan view of a portion of a circuit board with a plurality of prior art solder pads.

Referring to FIG. 1, a portion of a prior art circuit board 10 is illustrated, including a plurality of prior art solder pads 12. The solder pads 12 typically are arranged along one or more edges 14 of the circuit board 10. The circuit board 10 can be either a circuit module or a mother board for description purposes, since the pads 12 are identical on each board and are configured in a mirror image to mate with the corresponding pads on the other board when the boards are interconnected. Each of the pads includes an electrical lead or circuit runner 16 to connect the pads 12 to the components on the board 10 in a conventional manner.

Figure 2:
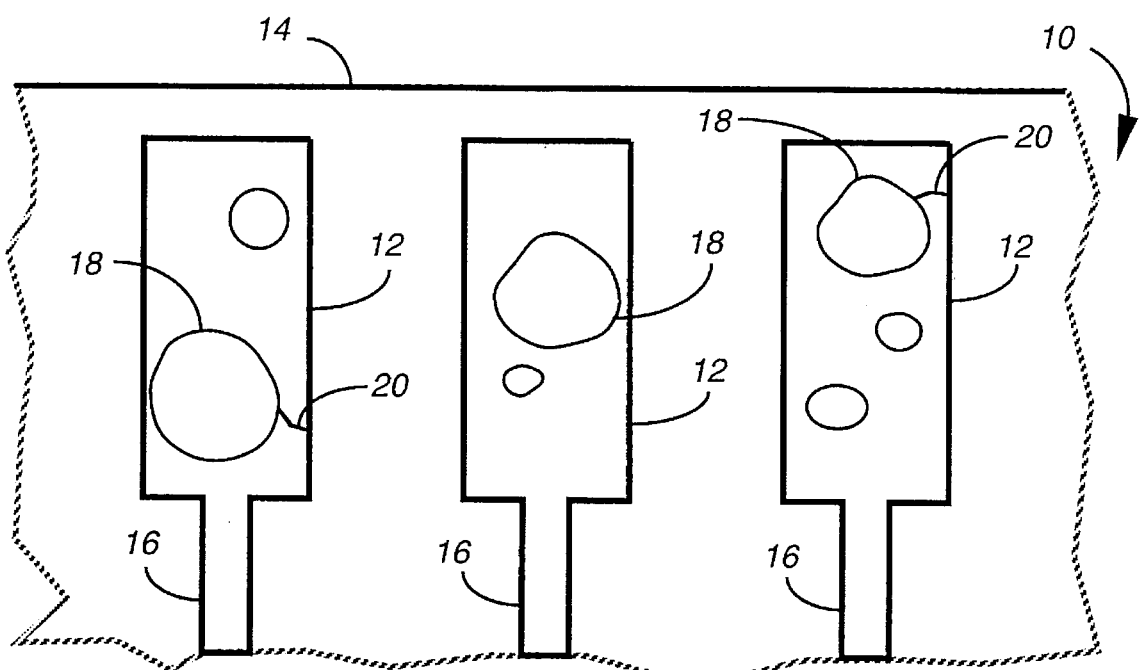
FIG. 2 is a top-plan view of the prior art solder pads, including defects in the interconnections.

As illustrated in FIG. 2, Applicants have found that the pads 12 can include one or a plurality of defects when the circuit modules and mother board are placed together and interconnected by reflowing the solder which form the pads 12. The defects generally are in the form of voids 18, which can be of any shape and location, resulting from a trapping of the flux medium when the solder pads 12 are reflowed to interconnect the boards. The voiding of the refluxed solder or the voids 18 also can cause cracks 20. The voids 18 and/or the cracks 20 are physical defects which can cause present or future potential electrical defects in the completed product.

FIG. 2 depicts the defects 18 and 20 as they would look if the board 10 were cleaved from the mating circuit board for illustration purposes. The actual defects 18 and 20 were discovered by x-raying the interconnected circuit boards. Also, the pattern and number of defects are for illustration purposes and can be more or less in number, size, and location.

Figure 3:
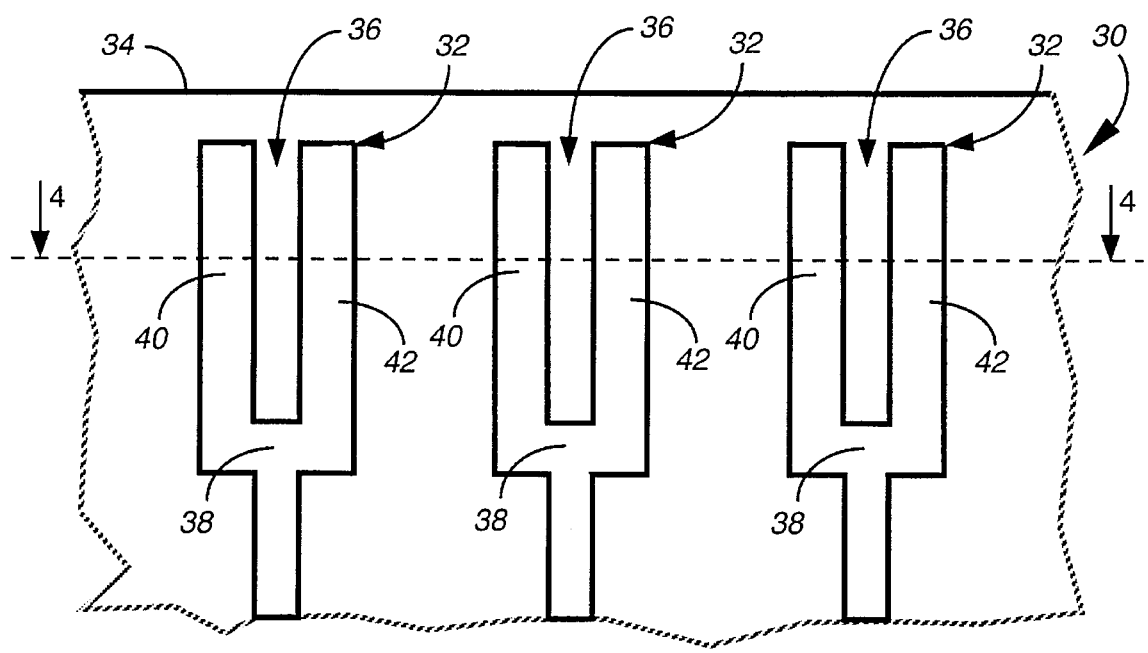
FIG. 3 is a top-plan view of a portion of a circuit board with one embodiment of the solder pads of the present invention.

To eliminate these defects, Applicants developed a method and structure for venting the solder fluxes when the solder pads are reflowed to interconnect the boards. One embodiment of the present invention is illustrated in FIG. 3, including a portion of a circuit board 30, which can be either a circuit module or a mother board, and for example purposes, will be described as the circuit module. The circuit module 30 includes a plurality of solder pads 32, again located adjacent an edge 34 of the circuit module 30.

Each of the solder pads 32 includes a venting channel 36 to allow the flux medium to escape when the solder pads 32 are reflowed to interconnect a pair of circuit boards. The venting channel 36 is formed from the solder pads 32 by forming a base portion 38 and a pair of arms or fingers 40 and 42. The specific width of the portion 38 and the arms 40 and 42 is not critical so long as they provide both good physical and electrical contact, while forming a sufficient vent 36 to allow the flux medium to escape upon reflowing of the solder.

Figure 4:
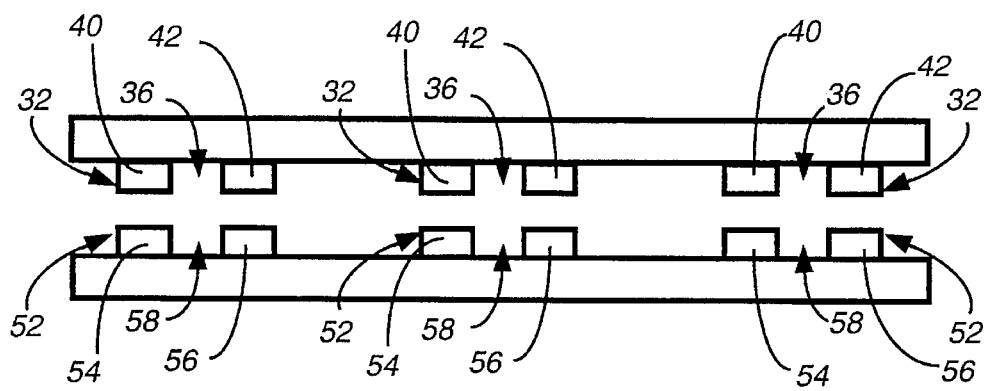
FIG. 4 is a partial side-plan view of the solder pads of the present invention on mating portions of both the circuit modules and mother board taken along the line 4—4 in FIG. 3.

Referring to FIG. 4, a complete venting channel is formed by mating the circuit module 30 to a mother board 50, which includes a plurality of mirror image solder pads 52 to the solder pads 32. Again, the solder pads 52 include a pair of arms 54 and 56 and a venting channel 58 which mates with the venting channel 36 to provide the complete venting channel for the interconnected boards 30 and 50. The thickness of the solder pads 32 and 52 is exaggerated for illustration purposes.

The individual solder pads 32 and 52, preferably have the same shape and outer profile as the pads 12 to eliminate changes in the basic design of the boards 30 and 52 over the prior design of the circuit module or circuit board 10.

The invention, however, is not limited to the rectangular solder pad configurations 32 and 52, but can be of other shapes such as square, rounded, or round as desired. In any solder pad configuration, the key is to provide the venting channel to allow the flux medium to escape without forming voids in the completed interconnected solder pads.

Figure 5:
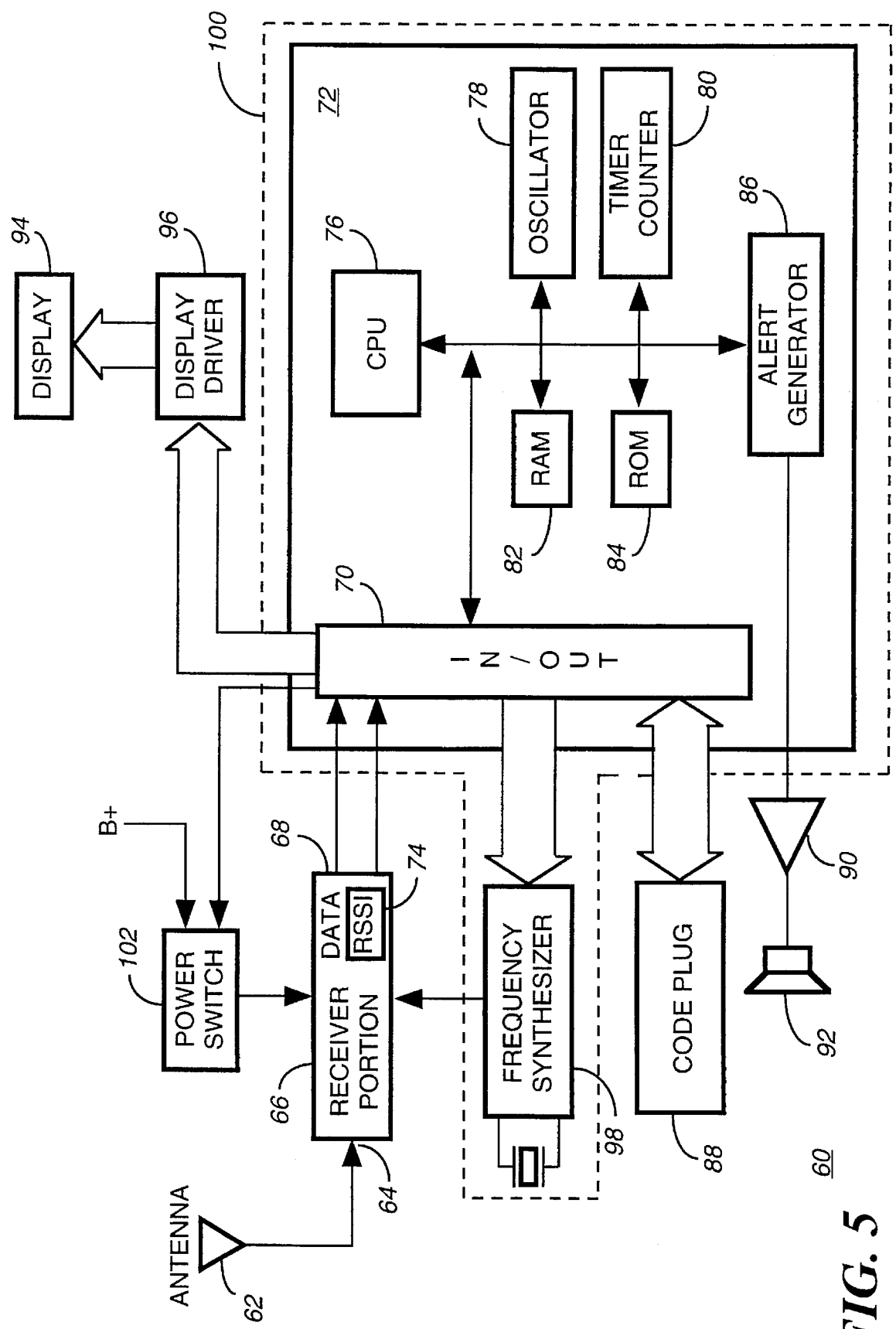
FIG. 5 is a block diagram of a pager in which the solder pads of the present invention can be utilized.

Referring to FIG. 5, a block diagram of a pager scanning or selective call receiver or receiver means 60 in which the present invention can be utilized is illustrated. Further details of the pager system incorporating the receiver 60 are disclosed in U.S. Pat. No. 5,206,855, assigned to the assignee of the present invention and incorporated herein by reference.

The general coded message signals are received by an antenna 62 which is coupled to an input 64 of a receiver 66. The receiver 66 preferably is an FM receiver, which processes the received signals in a manner well known to one skilled in the art. The processed signals are provided at an output 68 as a serial stream of binary information. The output 68 is coupled to an input/output (I/O) port 70 of a microcomputer 72. The receiver 66 includes a received signal strength indicator (RSSI) 74, which output also is coupled to the I/O port 70 of the microcomputer 72. The microcomputer 72, such as a Motorola MC68HC05L6 microcomputer, performs a variety of functions. The microcomputer 72 includes a CPU 76, an oscillator 78, a timer counter 80, a random access memory (RAM) 82, a read only memory (ROM) 84, and an alert tone generator 86. The CPU 76 controls the operation of the scanning receiver 60 and processes the received coded message signals. The oscillator 78 provides the clock for the operation of the CPU 76 and provides the reference clock for the timer counter 80. The frequency of the oscillator 78 is controlled by a crystal (not illustrated).

The assigned transmission slot, channel information, and pager addresses are in a code plug 88, which is a programmable read-only-memory (EEPROM). The RAM 82 is utilized to store the code plug information when the scanning receiver 60 initially is turned on and to store any messages as they are received. The ROM 84 contains the firmware controlling the microcomputer operation. The firmware includes such programs as those for controlling the decoding of transmission slot identity information, channel identification information, pager address, receiver scanning, and other receiver functions. The alert generator 86 generates an audible alert signal upon reception of a message by generating an alert signal coupled to a driver 90 which drives a transducer 92 to provide an audio alert. The alert signal also can be presented on a display 94 via the I/O 70, and a display driver 96 if desired. The microcomputer 72 in conjunction with a frequency synthesizer 98 functions as a channel selector 100 for the scanning receiver 60, when assigned predetermined channel information is not detected. A power switch 102, in conjunction with the microcomputer 72, provides a battery saving function for the scanning receiver 60.

The solder pads 32 and 52, of the present invention, can be utilized in any type of electronic product having surface mounted components. In the pager receiver 60, one or more of the elements such as the display driver 96, the CPU 76, the RAM 82, and the ROM 84, can be mounted on the circuit module 30, while the other elements can be mounted on the mother board 50.

As stated previously, the solder pad geometry can vary, but becomes more critical as the density of the solder pads increases and the size of the solder pads decreases. The arms or fingers 40 and 54 will flatten somewhat in the reflow interconnect process, as is well known. The balance is to determine the maximum surface area in the arms 40 and 54 and the base portion 38, while still maintaining an open venting channel 36 and 58 between the reflowed arms 40 and 54. As illustrated, the solder pads 32 and 52 are of a rectangular geometry, with the arms 40 and 54 formed along the length of the rectangular geometry.

What is claimed is:

1. A method of interconnecting a circuit module board to a mother board, comprising:

forming a solder pad for each lead on each of said circuit module board and on said mother board in a mirror image to each other;

forming each solder pad adjacent at least one edge of one of said boards and forming a venting channel in each solder pad opening toward said edge on the circuit module board and on the mother board;

placing said boards together and reflowing said solder pads on each of said boards to reflow and interconnect said boards, whereby solder medium from said solder pads is allowed to vent through said venting channels during reflow to avoid forming defects in interconnections of mating solder pads of the circuit module board and the solder pads of the mother board.

2. The method as defined in claim 1, where the step of forming the solder pads further comprises forming a pair of arms on each solder pad and forming said venting channel opening to said edge between said arms.

3. The method as defined in claim 2, where the step of forming the solder pads further comprises forming said solder pads in a rectangular geometry, with said arms formed along the length of said rectangular geometry.

4. The method as defined in claim 1, and further comprising the step of forming said circuit module board and said mother board as a portion of a portable electronic device.

5. The method as defined in claim 4 including forming said circuit module board and said mother board as a portion of a selective call receiver.

6. In combination, a first circuit board and a second circuit board attached to one another, the first circuit board and the second circuit board each comprising:

a plurality of leads each having a solder pad formed adjacent at least one edge of the first or second circuit board, respectively, each of said solder pads on the first circuit board and the second circuit board including a venting channel formed therein and opening toward said edge of said circuit board, wherein when the first and second circuit boards are placed together with their solder pads aligned and the solder pads subjected to a reflow process, solder medium from the solder pads is allowed to vent through the venting channels of mating solder pads to avoid forming defects at interconnections of mating solder pads of the first circuit board with the solder pads on the second circuit board.

7. The combination as defined in claim 6 wherein said first circuit board and the second circuit board make up a portion of a portable electronic device.

8. The combination as defined in claim 6 wherein each solder pad includes a pair of arms with said venting channel formed between said arms.

9. The combination as defined in claim 8 wherein each said solder pad is formed in a rectangular geometry, with said arms formed along the length of said rectangular geometry.

10. The combination of claim 8, wherein said first circuit board and the second circuit board make up a portion of a portable electronic device.

\* \* \* \* \*